US010672603B2

(12) United States Patent
Anderson (10) Patent No.: US 10,672,603 B2
(45) Date of Patent: Jun. 2, 2020

(54) SYSTEM AND METHOD FOR REMOVING DIELECTRIC MATERIAL

(71) Applicant: Infineon Technologies AG, Neubiberg (DE)

(72) Inventor: Gregory Anderson, Northville, MI (US)

(73) Assignee: Infineon Technologies AG, Neubiberg (DE)

( * ) Notice: Subject to any disclaimer, the term of this patent is extended or adjusted under 35 U.S.C. 154(b) by 75 days.

(21) Appl. No.: 14/921,316

(22) Filed: Oct. 23, 2015

(65) Prior Publication Data
US 2017/0117139 A1    Apr. 27, 2017

(51) Int. Cl.
*H01L 21/02* (2006.01)
*B23K 26/00* (2014.01)

(52) U.S. Cl.
CPC ........ *H01L 21/02098* (2013.01); *B23K 26/00* (2013.01)

(58) Field of Classification Search
CPC ... H01L 21/02098; B23K 26/00; B23K 26/14; B23K 26/16; B23K 26/0626; B23K 26/362; B08B 15/00; B29D 11/00; A61F 9/007
USPC ............ 219/121.84, 121.67, 121.68, 121.72, 219/121.6, 121.85, 121.69, 121.82, 219/121.86, 121.62, 121.7, 121.61, 219/121.78, 121.14, 121.24, 121.33, 219/121.48, 121.51, 121.59, 121.63,
(Continued)

(56) References Cited

U.S. PATENT DOCUMENTS 4,671,848 A * 6/1987 Miller .................... B01J 19/121
216/58
4,839,181 A    6/1989 MacMurray et al.
(Continued)

FOREIGN PATENT DOCUMENTS

CN         1617783 A     5/2005
CN      102218415 A    10/2011
(Continued)

OTHER PUBLICATIONS

Yamaguchi, Shigeru, JPH0839279A, Laser Beam Irradiating Method, Feb. 13, 1996, Espacenet translation, Description.*
(Continued)

*Primary Examiner* — Tu B Hoang
*Assistant Examiner* — Masahiko Muranami
(74) *Attorney, Agent, or Firm* — Shumaker & Sieffert, P.A.

(57) ABSTRACT

A system is described for removing a dielectric gel, which has been layered atop the electrical components of a failed electrical system, without further damaging the electrical components of the failed electrical system. The system includes a raster component configured to project a laser for vaporizing a dielectric layer of an electric component into a plasma plume located above the dielectric layer. The system further includes a first vacuum nozzle positioned on a first side of the raster component and configured to extract a first portion of the plasma plume while the plasma plume is located above the dielectric layer, and a second vacuum nozzle positioned on a second side of the raster component and configured to extract a second portion of the plasma plume while the plasma plume is located above the dielectric layer.

16 Claims, 8 Drawing Sheets

(58) Field of Classification Search
USPC ............ 219/121.64, 121.71, 121.74, 121.75, 219/121.76, 121.83, 121.73; 134/1, 1.1, 134/1.2, 1.3
See application file for complete search history.

(56) References Cited

U.S. PATENT DOCUMENTS

| | | | | |
|---|---|---|---|---|
| 5,720,894 | A * | 2/1998 | Neev ..................... | A61B 18/20 216/65 |
| 5,736,709 | A * | 4/1998 | Neiheisel ............. | B08B 7/0042 219/121.61 |
| 5,780,806 | A * | 7/1998 | Ferguson ............. | B08B 7/0042 134/1 |
| 6,156,030 | A * | 12/2000 | Neev ..................... | A61B 18/20 216/94 |
| 6,494,965 | B1 * | 12/2002 | Walker ................... | B08B 5/02 134/104.2 |
| 6,799,584 | B2 * | 10/2004 | Yogev ............... | H01L 21/67051 134/1 |
| 8,314,410 | B2 | 11/2012 | Straw et al. | |
| 2003/0183603 | A1 | 10/2003 | Forsman et al. | |
| 2006/0249816 | A1 * | 11/2006 | Li ...................... | B23K 26/0604 257/618 |
| 2007/0151958 | A1 * | 7/2007 | Modra .................. | B23K 26/16 219/121.67 |
| 2009/0160075 | A1 * | 6/2009 | Simpson .............. | A61B 3/1015 264/1.37 |
| 2009/0314753 | A1 * | 12/2009 | Kosmowski .......... | B23K 26/14 219/121.72 |
| 2011/0076847 | A1 * | 3/2011 | Aqui ................... | C23C 14/5813 438/674 |
| 2011/0164248 | A1 | 7/2011 | Bushaw et al. | |
| 2014/0263221 | A1 * | 9/2014 | Minehara ................ | G21F 9/005 219/121.73 |
| 2014/0291305 | A1 * | 10/2014 | Straw ................ | B23K 26/0648 219/121.69 |
| 2014/0305917 | A1 * | 10/2014 | Gadd ..................... | B23K 26/36 219/121.72 |
| 2015/0165560 | A1 * | 6/2015 | Hackert ................ | C03B 33/082 428/43 |
| 2015/0265351 | A1 | 9/2015 | Haight et al. | |

FOREIGN PATENT DOCUMENTS

| | | |
|---|---|---|
| CN | 102812533 A | 12/2012 |
| CN | 104096968 A | 10/2014 |
| EP | 0054315 A2 | 6/1982 |
| JP | H0839279 * | 2/1996 ............ B23K 26/04 |
| JP | 2013063864 * | 4/2013 ............ B23K 26/00 |
| WO | 1993010697 A1 | 6/1993 |

OTHER PUBLICATIONS

Fujii, Takahide et al, JP2013063864A, Glass Plate Cutting Method and Glass Plate Cutting Device, Apr. 11, 2013, Espacenet translation, Description, Drawings.*

Brown et al., "Chapter 4: Fundamentals of Laser-Material Interaction and Application to Multiscale Surface Modification," Laser Precision Microfabrication, Springer Series in Materials Science, vol. 135, Jun. 30, 2010, pp. 91-120.

"Understanding Laser Beam Parameters Leads to Better System Performance and Can Save Money," Coherent, retrieved from http://www.coherent.com/downloads/understandinglaserbeamparameters.pdf on Oct. 15, 2015, 5 pp.

Budd et al., "Comparison of CO2 and Nd:YAG Lasers for Industrial Applications," Sam's Laser FAQ, Carbon Dioxide Lasers, retrieved from http://www.repairfaq.org/sam/laserco2.htm#co2ccy on Oct. 15, 2015, 3 pp.

Nelson et al., "Predicting laser beam characteristics, Mode quality (M2) measurement improves laser performance," Beam Analysis, Wiley-VCH Verlag GmbH & Co., Jan. 2012, pp. 36-39.

"Laser beam divergence and spot size," retrieved from http://vlab.amrita.edu/?sub=1&brch=189&sim=342&cnt=1 on Oct. 15, 2015, 2 pp.

Metzbower, "Penetration Depth in Laser Beam Welding," Welding Research Supplement, Aug. 1993, pp. 403-407.

"FAQ—The Best Laser . . . Continued," SpectraMedics, retrieved from http://www.spectramedics.com/index.php?id=105 on Oct. 15, 2015, 3 pp.

Janik et al., "Laser Resurfacing," Semin Plast Surg, vol. 21, No. 3, Aug. 2007, pp. 139-146.

Mosquera et al., "Analytical optimization of the ablation efficiency at normal and non-normal incidence for generic super Gaussian beam profiles," Biomedical Optics Express, vol. 4, No. 8, OSA, Aug. 1, 2013, pp. 1422-1433.

Grace et al., "The Use of Laser Scanning Cytometry to Assess Depth of Penetration of Adenovirus p53 Gene Therapy in Human Xenograft Biopsies," American Journal of Pathology, vol. 155, No. 6, Dec. 1999, pp. 1869-1878.

"Micromachining and Material Processing with Amplified Picosecond Lasers," retrieved from http://www.aerodefensetech.com/component/content/article/939-dtb/features/feature-articles/13946, Jun. 1, 2012, 2 pages.

"Laser Skin Resurfacing," retrieved from http://www.ienhance.com/procedures/laser-skin-resurfacing on Oct. 15, 2015, 5 pp.

"Laser Skin Resurfacing," retrieved from http://drsawisch.com/cosmetic-procedures/laser-skin-resurfacing on Oct. 15, 2015, 13 pp.

"Flexible CO2 Laser for Gynecology," OmniGuide, retrieved from http://www.promedics.de/Downloads/OMNIGUIDE/OMNIGUIDE_komplett_2012.pdf on Oct. 15, 2015, 4 pp.

"OmniGuide's BeamPath System for Otology and Neurotology," OmniGuide, Jan. 2010, 8 pp.

"Dr. Rudiger Paschotta, Founder and Executive of RP Photonics Consulting GmbH," RP Photonics Consulting GmbH, RP Photonics, retrieved from https://www.rp-photonics.com/paschotta.html on Oct. 15, 2015, 4 pp.

Office Action, in the Chinese language, from counterpart Chinese Application No. 201610918078.0, dated Sep. 17, 2019, 8 pp.

* cited by examiner

SYSTEM AND METHOD FOR REMOVING DIELECTRIC MATERIAL

BACKGROUND

Dielectric materials are sometimes used as an insulating layer to protect electrical components of printed circuit boards, modules, and other chips from damage. For example, a high-power transistor module, such as an insulated-gate bi-polar transistor (IGBT) high power module for an automotive application, may operate at voltages of approximately 650 volts and currents of approximately 1600 amps, and have a power dissipation of around 1500 watts. With such high operating voltages, currents, and power, the high-power transistor module may include a thick layer of dielectric insulating material (e.g., gel) covering the chips, diodes, and other electrical components of the high-power transistor module for protection (e.g., against arching).

Unfortunately, a protective layer of dielectric gel may inhibit failure analysis of a module, should one or more of the electrical components eventually fail. Therefore, in order to accurately determine the root cause of a failure, the dielectric insulating gel must be removed before proper inspection of an affected area on a module can be performed.

SUMMARY

In general, circuits and techniques are described for using a laser system to quickly remove a protective dielectric gel, which has been layered atop the electrical components of a failed electrical system, without causing recast and without further damaging the components of the electrical system. The laser system uses a laser to vaporize the gel into a plasma plume above a heat-affected-zone of the dielectric material, and then use two or more specifically designed vacuum nozzles to extract the plasma plume from the heat-affected-area.

In one example, the disclosure is directed to a system that includes a raster component configured to project a laser for vaporizing a dielectric layer of an electric component into a plasma plume located above the dielectric layer, a first vacuum nozzle positioned on a first side of the raster component and configured to extract a first portion of the plasma plume while the plasma plume is located above the dielectric layer, and a second vacuum nozzle positioned on a second side of the raster component and configured to extract a second portion of the plasma plume while the plasma plume is located above the dielectric layer.

In another example, the disclosure is directed to a method that includes while projecting, from a raster component, a laser onto a dielectric layer of an electric component to generate a plasma plume above the dielectric layer: extracting, with a first vacuum nozzle positioned on a first side of the raster component, a first portion of the plasma plume while the plasma plume is located above the dielectric layer, and extracting, with a second vacuum nozzle positioned on a second side of the raster component, a second portion of the plasma plume while the plasma plume is located above the dielectric layer.

In another example, the disclosure is directed to system that includes means for projecting a laser onto a dielectric layer of an electric component to generate a plasma plume above the dielectric layer. The system further includes means for extracting a first portion of the plasma plume while the plasma plume is located above the dielectric layer, and means for extracting a second portion of the plasma plume while the plasma plume is located above the dielectric layer.

The details of one or more examples are set forth in the accompanying drawings and the description below. Other features, objects, and advantages of the disclosure will be apparent from the description and drawings, and from the claims.

DETAILED DESCRIPTION

Many techniques have been tried in the past to remove a protective, dielectric layer from an electric component. However these previous techniques may suffer from one or more drawbacks, such as, being slow (e.g., taking on the order of one to several hours to complete), producing large quantities of hazardous waste or other by-products, and damaging the surface and sub-components of the electrical component that are positioned underneath the dielectric layer.

For instance, solvents can be used to clean and dissolve dielectric materials. Unfortunately, solvents may take several hours or even days to completely dissolve a protective gel and may also pose a risk of igniting and causing a fire. For example, some solvent cleaners will generate heat and even reach temperatures that exceed the flash point of the chemical solvent. Other down-sides to solvents are that some solvent-based removal techniques may also generate large amounts of hazardous waste as by-products of the removal process. Handling, transferring, and disposing of large quantities (e.g., one or more half-gallons) of hazardous waste can be dangerous and expensive. Furthermore, due to their abrasive nature, some solvent based removal techniques may damage the surface and sub-components of the electrical component that are positioned underneath the dielectric layer (e.g., located at the die layer), further inhibiting proper failure analysis.

In other applications, high-pressure sandblasting and/or pressure washing techniques are used to remove dielectric gels from electric components. In the process of removing the dielectric gel, a high-pressure wash or a high-pressure sand blast can mangle wires, connectors, and other sub-components located at beneath the dielectric, and potentially destroy evidence of a failure. Furthermore, high-pressure washing techniques may also produce large amounts of hazardous waste, resulting in similar drawbacks as solvents.

As a faster alternative that may produce less hazardous waste, some applications use lasers to remove protective layers from electric components. For example, carbon dioxide ($CO_2$) lasers may be used to remove dielectric material from an electric component. The $CO_2$ laser also locally heats the dielectric material, however due to the 10 nanometer wavelength of the $CO_2$ laser, the laser is completely absorbed by the dielectric material, thus preventing the laser from reaching and damaging the parts of the electrical component that are located beneath the dielectric layer. The $CO_2$ laser is moved back and forth across the surface of the electric component to remove small individual layers (e.g., 30 microns thick) of dielectric at a time. Similarly, as an alternative to $CO_2$ lasers, an inferred (IR) yttrium aluminum garnet (YAG) laser may be used to melt areas of a dielectric gel layer through localized heating. Unfortunately, the 1064 nanometer wavelength of the YAG laser may transmit through a dielectric gel and damage the underlying surface and sub-components of the electrical component.

In the case of $CO_2$ lasers, if the $CO_2$ laser focuses for sufficient duration of time on an area of the gel, the dielectric gel may be vaporized. The vaporization of the dielectric produces a plasma plume of dielectric material that is ejected out and above the working surface of the electric component. To prevent the vaporized dielectric material from falling back onto the working surface of the component, a blower is sometimes used to blow the plasma plume in the direction of a vacuum nozzle that extracts vaporized dielectric material out and away from the work surface. Unfortunately, blowing the plasma plume fans the surface of the electric component causing a turbulence producing phenomena called "recast". Recast causes the build-up of carbonized material on the surface of the electric component being treated as some of the plasma plume is blown back onto the surface of the electric component. The $CO_2$ laser is less efficient in vaporizing dielectric material that is covered with recast and therefore, more time and passes with the laser are required to clean the surface of the component.

In general, circuits and techniques are described for using a laser system to efficiently, and quickly remove a protective dielectric gel, which has been layered atop the electrical components of a failed electrical system, without causing recast and without further damaging the components of the electrical system. The laser system uses a laser to vaporize the gel use into a plasma plume above a heat-affected-zone of the dielectric material, and then use two or more specifically designed vacuum nozzles to extract the plasma plume from the heat-affected-area. In some examples, the laser system may remove a protective dielectric gel in mere minutes rather than hours. In addition, the resulting amount of hazardous waste produced by the example system, if any, may be only a few milliliters rather than the gallons produced by other processes.

Figure 1A:
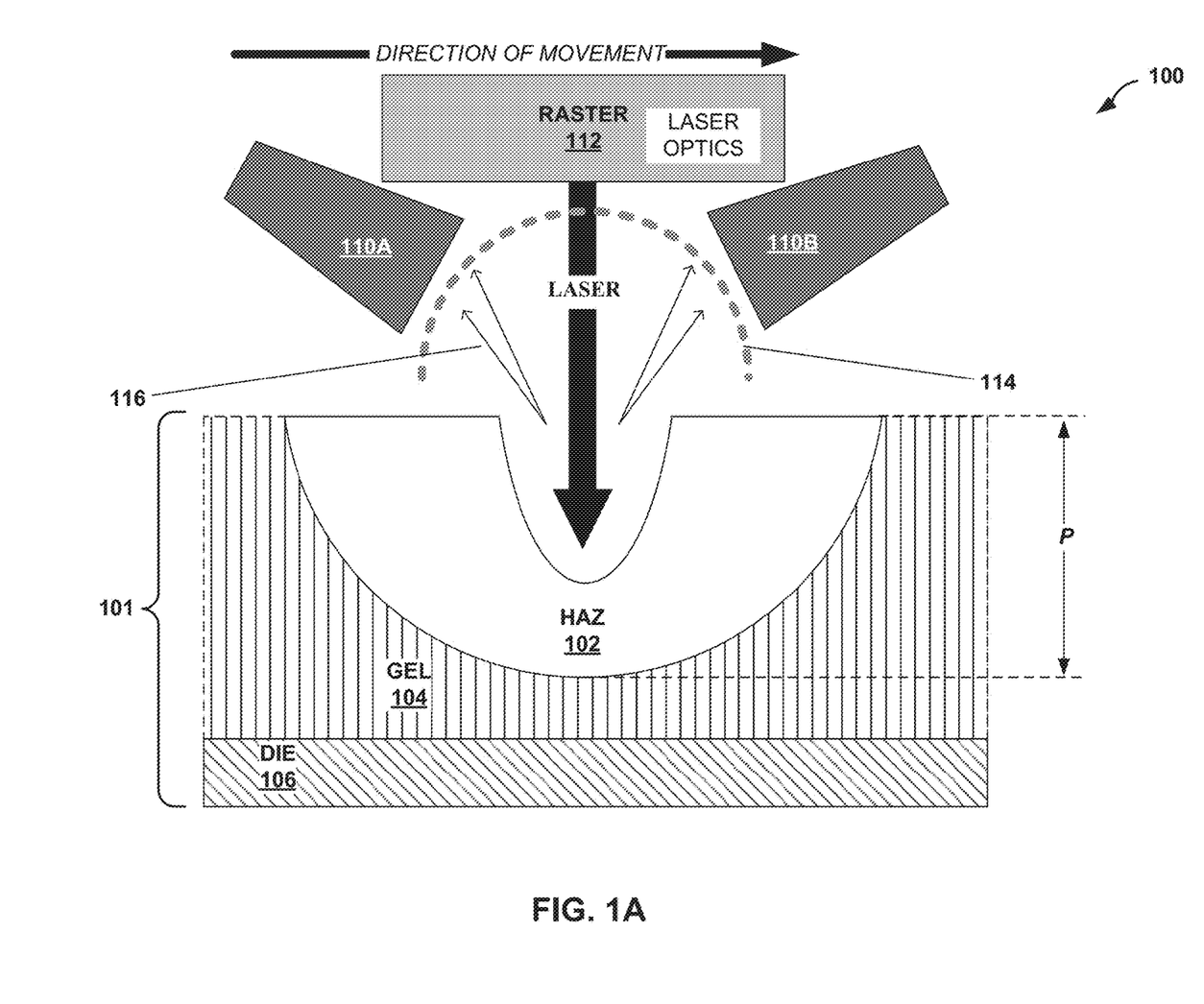
FIGS. 1A and 1B are conceptual diagrams illustrating different views of an example laser system for removing a protective layer of dielectric gel from an electrical component, in accordance with one or more aspects of the present disclosure.
Figure 1B:
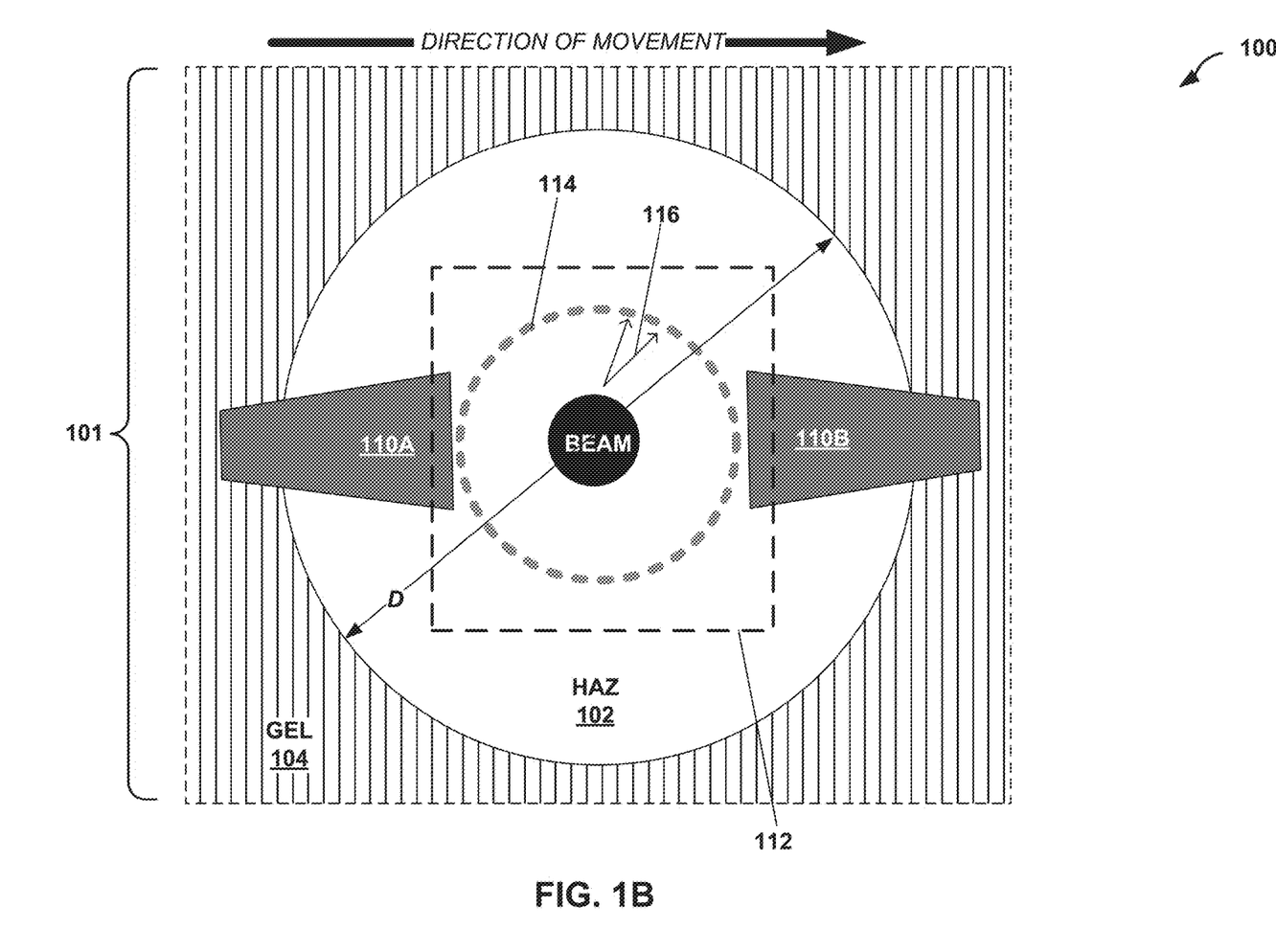

FIGS. 1A and 1B are conceptual diagrams illustrating two different views of laser system 100 as an example laser system for removing a protective layer of dielectric gel from an electrical component, in accordance with one or more aspects of the present disclosure. FIG. 1A is a conceptual diagram illustrating a cross-sectional side view of system 100 and FIG. 1B is a conceptual diagram illustrating a top-down view of system 100.

System 100 includes electric component 101 positioned underneath raster component 112. System 100 also includes two vacuum nozzles 110A and 110B positioned on opposite sides of raster component 112. Although not shown, system 100 may include a controller that controls raster component 112.

Electric component 101 includes two layers being shown, gel layer 104 and die layer 106. In some examples, electric component 101 may include additional layers that are not shown.

Die 106 represents a layer of semiconducting material (e.g., Silicon, Gallium Nitride, or other semiconducting material) on which a given functional circuit associated with electric component 101 may be fabricated. Gel layer 104 represents a protective layer of dielectric material or gel that is deposited atop die 106 to protect die 106 (e.g., from arching). Gel layer 104 is an electrical insulator that may prevent electric charges from flowing through the material and down to or up from die 106.

In operation, electric component 101 may fail and need to undergo analysis. To analyze different parts of electric component 101 for a failure, portions of gel layer 104 may need to be removed so that the potentially faulty areas of die 106 can be examined.

Raster component 112 is configured to project a laser downward onto electric component 101 to remove gel layer 104. Although not shown, system 100 may include a controller that controls raster component 112. For example, the controller may control the settings of raster component 112 (e.g., laser power, galvanic speed, and other settings as described below).

Raster component 112 is configured to project a laser with sufficient properties for vaporizing gel layer 104 and projecting dielectric material 116 from gel layer 104 as plasma plume 114 located above gel layer 104. For example, raster component 112 may be configured to follow a fill pattern mapped atop gel layer 104 while projecting the laser for vaporizing gel layer 104. The fill pattern may be either a cross grid, a vertical grid, or a horizontal grid type fill pattern. By following the fill pattern at a certain rate or speed, as raster component 112 projects the laser, system 100 may heat thin (e.g., 30 micron) layers of gel layer 104. As gel layer 104 is heated by the laser, portions of dielectric material 116 may eject from gel layer 104 and form plasma plume 114.

As gel layer 104 is vaporized, rather than use a blower to guide dielectric material 116 in the direction of a vacuum nozzle, system 100 uses two or more vacuum nozzles 110A and 110B and the properties of plasma plume 114 to extract dielectric material 116 from gel layer 104. That is, since dielectric material 116 is already ejected into the air when vaporized by the laser of raster component 112, there is no need for blow off. Using two (or more) specifically designed vacuum nozzles 110A and 110B (which as described below are set at specific angles), system 100 can extract dielectric material 116 at the apex of plume 114 without blow off and before dielectric material 116 falls back onto electric component 101.

Nozzles 110A and 110B may move in-line with the direction of movement of raster component 112. As such, nozzles 110A and 110B may extract dielectric material 116 from plasma plume 114 as plasma plume 114 moves with raster component 112. As is described in greater detail below, nozzle 110A is positioned on a first side of raster component 112 and configured to extract a first portion of plasma plume 114 while plasma plume 114 is located above gel layer 104 and nozzle 110B is positioned on a second (e.g., opposite) side of raster component 112 and is configured to extract a second portion of plasma plume 114 while plasma plume 114 is located above gel layer 104. In some examples, the first portion of plasma plume 114 and the second portion of plasma plume 114 being extracted by nozzles 110A and 110B constitute approximately the entire volume of plasma plume 114. In other examples, nozzles 110A and 110B are configured to extract less than the entire volume of plasma plume 114.

In some examples, raster component 112 is configured to project a 40 watt, continuous-wave, CO2 laser which has a wavelength of approximately 10 microns. However, in other examples, raster component 112 may be configured to project other types of continuous or non-continuous type lasers that have respective wavelengths that cause the laser to be absorbed by the dielectric material of gel layer 104 and not project through to die layer 106.

For example, consider that all materials in relation to electromagnetic energy are opaque, semi-opaque, or transparent. Depending on the physical and chemical compositions of these materials, electromagnetic energy maybe transmitted, reflected, or absorbed. Raster component 112 is configured to project a laser that vaporizes gel layer 104 without protruding through layer 104 and potentially damaging die layer 106. Therefore, raster component 112 must project a laser that has a suitable wavelength that corresponds to the absorption qualities of gel layer 104.

For example, since typical dielectric gels are clear and transparent to visible light, using an infrared laser, such as an IR YAG laser, to vaporize gel layer 104 can be difficult as the infrared energy associated with the IR YAG laser can be transmitted through clear and transparent mediums at some wavelengths. Unlike IR YAG lasers, a CO2 laser typically exhibits a 10 micron infrared wavelength which is on the far side of the infrared spectrum (e.g., closer to microwaves). Since the 10 micron wavelength is closer to microwaves, the CO2 laser has better absorption qualities when focused on translucent materials, such as gel layer 104. Accordingly, raster component 112 may be configured to project a CO2 laser for removing gel layer 104 because the CO2 laser is more suitable for removing gel layer 104 because of the absorption qualities of CO2 lasers.

In addition to projecting a laser with a suitable wavelength for absorption by gel layer 104, raster component 112 must project a laser with other properties for sufficiently vaporizing gel layer 104 into plasma plume 114. For example, because the CO2 laser is absorbed by gel layer 104 when projected from raster component 112, the energy of the CO2 laser beam may cause phenomena known in the field of laser ablation as "recast". Recast is the buildup of carbonized material due to too much energy being absorbed by the dielectric material, such as gel layer 104. That is, too much energy associated with a laser hitting gel layer 104 may cause the material of gel layer 104 to carbonize rather than vaporize, whereas not enough energy associated with the laser may cause the material of gel layer 104 to transform into a thin white flake material because of shallow absorption depth. To avoid recast and to cause gel layer 104 to vaporize into plasma plume 114, raster component 112 must tune the CO2 laser being projected onto electric component 101.

For example, raster component 112 may tune the CO2 laser by adjusting the quality and the spot pattern. The quality of a laser beam is defined by its M2 factor (also known as beam propagation ratio), and the spot pattern corresponds to the Transverse Electromagnetic Mode (TEM) property of the laser.

Raster component 112 may project a laser with a TEM00 spot pattern. In other words, raster component 112 may have a "single spot pattern" as opposed to a "multiple spot pattern." FIG. 1B shows the single spot pattern of the laser beam being projected by raster component 112.

The M2 factor relates to the quality of the laser beams in terms of divergence and determines how well raster component 112 can focus the laser beam. However, since M2 factor cannot be measured, the M2 value must be calculated using the uncertainty principle and Rayleigh measurements from the real beam in relation to a Gaussian theoretical perfect beam with an M2 value of 1.

The M2 value is simply an indicator of how close the real beam is to perfect. An imperfect beam may have an M2 value greater than 1. Beams exhibiting M2 factors ranging from 1.1 to 1.3 are considered high quality because currently, there is no perfect beam with an M2 factor of 1 in existence.

The M2 factor and spot pattern together directly affect the power intensity of the CO2 laser with regards to its heating of gel layer 104. The intensity of the CO2 laser varies based on distance from the center of the beam such that the intensity is greater near the center of the beam and less intense towards the edges. The variation in intensity with respect to distance resembles a bell curve. A TEM00 spot pattern laser has its highest power intensity at the center of the beam which is why TEM00 spot pattern lasers are considered highest in quality.

Raster component 112 may further tune the CO2 laser by adjusting the laser power, the duty cycle of the RF signal associated with the laser, the galvanic ("galvo") speed of the laser, and/or the focal length of the laser. For example, with regards to laser power, system 100 may rely on a power supply (e.g., 30V DC) to provide power to raster component 112 for powering the CO2 laser. The output from the power supply may be converted to a radio frequency (RF) signal via a crystal controlled oscillator. Raster component 112 may discharge the converted RF signal into the electrodes of a laser tube filled with CO2 gas which may excite the CO2 gas and exit the tube as a CO2 laser beam. Adjustments to the laser power may be required get gel layer 104 into a vaporized state. In some examples, the laser power may be 28 watts.

The duty cycle of the RF signal is manipulated via pulse width modulation (PWM) and is what sets the time averaged RF power applied to the laser. The percentage of optical output associated with the laser increases as the pulse-width of the RF signal decreases.

The galvo speed represents the speed of raster component 112 as raster component 112 moves across electric component 101 (e.g., in accordance to a grid outline) and is measured in units per second. By adjusting the gavo speed, system 100 may control for how long the laser beam is directed on a particular location of gel layer 104. When vaporizing gel layer 104, a slow galvo speed may cause the laser to apply too much energy whereas the removal of gel layer 104 using the described techniques should be done in small layers at a time to as to reduce any potential recast effect. Therefore, in some examples, system 100 may use a very fast galvo speed such that dwell time will be short and the penetration depth of laser on gel layer 104 will be shallow. A fast speed may enable the laser to vaporize the gel layer 104 while also mitigating surface disruption, keeping the surface free from recast, and causing minimal, if any impact, to die layer 106 and the rest of electric component 101 that is beneath gel layer 104.

In some examples, there may be a direct relationship between the laser power and the galvo speed of raster component 112 when removing gel layer 104. For instance, in general, the higher the power settings, the faster the galvo speed should be and conversely, the lower the power setting, the slower the glavo speed should be (e.g., a power of setting 70% maximum or 28 watts may require a galvo speed of 700 units per second). However, at 28 watts of power, should the laser make direct contact with the components of die layer 106 (e.g., after gel layer 104 is vaporized and removed from component 101), the CO2 laser could cause damage to component 101. To prevent direct contact from the laser from damaging the components of layer 106, system 100 may ensure that raster component 112 operates the laser at a power setting that will not harm die layer 106 by ensuring the power setting is low enough to prevent thermal breakdown of the material of diel layer 106 and is low enough to prevent the wire bonds within die layer 106 from transferring IR heat from the laser that can further damage electric component 101. For example, the thermal break down of silicon from a 10 micron CO2 laser occurs when the power of the laser is at approximately 15 watts, therefore. To prevent damage from the laser, raster component 112 may output a laser with only 14 watts of power and/or move at galvo speeds of 350 or more time units.

In some examples, the power can be set at lower power settings and move at slower speeds to clean gel layer 104 from electric component 101. As gel layer 104 is removed, some of the IR energy from the laser may start reflecting off metal wire bonds and some of the IR energy may be absorbed by the wire bonds, resulting in potentially some carbonized gel to form. Because the key for good failure analysis is not to lose evidence of a failure. Some failures are the result of small particles being present beneath gel layer 104 that could potentially be disrupted or vaporized by the laser. Operating the laser at a low power setting may minimize the risk of losing evidence. Or in some examples, a lower power setting may be used when vaporizing a deeper layer of gel layer 104 (e.g., a layer closer to die layer 106) than the power setting used to vaporize a shallower layer (e.g., a layer near the surface of gel layer 104 that is initially exposed to the air).

In some examples, the focal length of the laser projected by raster component 112 is approximately 140 mm. That is, system 100 may include a camera for viewing the area of gel layer 104 that will be impacted by the laser when projected from raster component 112. The camera may view gel layer 104 from above (e.g., in a top-down view as shown in FIG. 1A). Laser optics may be coupled to the camera that can be adjusted via a Z control. For example, when the laser optics are focused on gel layer 104, the focal length of the laser may also be focused. The one-to-one correspondence between the laser optics focus and the focal length of the laser may pose a problem, particularly for thicker layers of gel. The problem arises because the laser beam may diverge as the laser propagates through gel layer 104, down to the components on die layer 106. The beam becomes weaker the further the beam travels through gel layer 104, making for possible inefficient vaporization of gel layer 104 and causing recast to develop. A couple of millimeters below or above the focal length can make the difference in the process and therefore, the Z control of the laser optics may need adjusting to bring gel layer 104 into focus for proper focal length.

Raster component 112 may further tune the CO2 laser by adjusting the size of the Heat Affected Zone (HAZ) associated with the laser. As shown in FIGS. 1A and 1B, HAZ 102 is the portion of gel layer 104 surrounding the laser beam being projected from raster component 112. HAZ zone 102 has a maximum penetration (e.g., depth) and a maximum diameter. When the beam strikes gel layer 104, the initial reaction is violent. The beam penetrates into gel layer 104 where the heat from the initial strike propagates outward with a maximum diameter D and downward to a penetration depth P. In response to the heat from the initial strike, waves of dielectric material 116 eject outward in a superheated plasma plume 114 upward from the irradiated portion of gel layer 104. Because the heat that propagates from the laser beam outward to diameter D and downward to penetration depth P changes the composition of HAZ 102 within gel layer 104, as well as, the topography of the material within HAZ 102, rastor component 112 must finely tune the CO2 laser power and depth so as to control the size (e.g., diameter and depth) of HAZ 102. Accordingly, as is described in greater detail below with respect to the additional FIGS., control over the size and placement of HAZ 102 by raster component 112 may also contribute to the tuning of the CO2 laser projected by raster component 112 for controlling the vaporization of gel layer 104.

Accordingly, the described techniques for removing a gel layer (e.g., Si based) of an electric component using a 10 micron CO2 laser may be faster and produce less hazardous waste than other techniques. Since every dielectric material may have its own unique material characteristics, lasers with other wavelengths may be used for other types of opaque, semi-opaque, and translucent materials.

Figure 2:
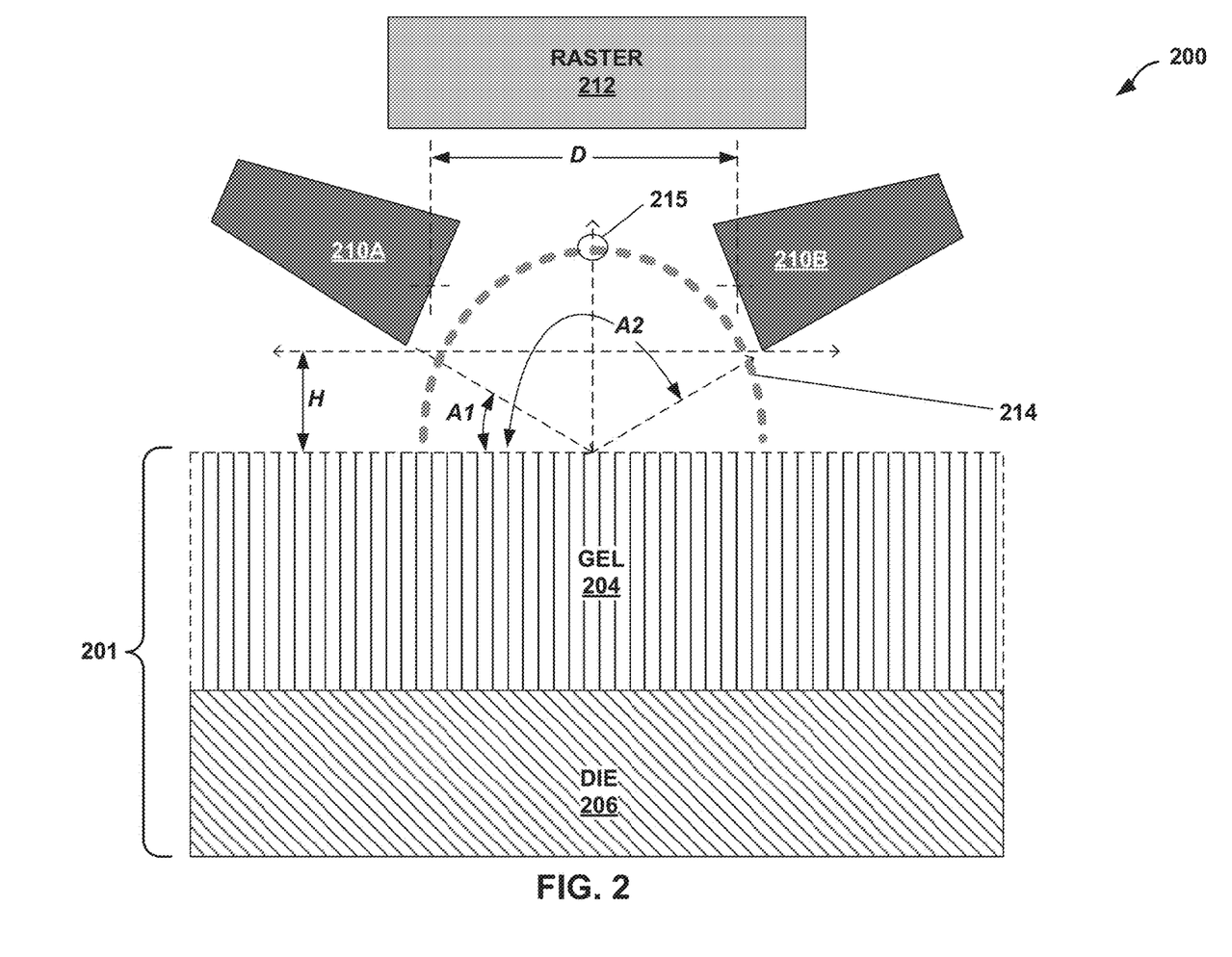
FIG. 2 is conceptual diagrams illustrating further details of an example laser system for removing a protective layer of dielectric gel from an electrical component, in accordance with one or more aspects of the present disclosure.

FIG. 2 is conceptual diagrams illustrating further details of laser system 200 as an example laser system for removing a protective layer of dielectric gel from an electrical component, in accordance with one or more aspects of the present disclosure. System 200 is described below in the context of system 100 of FIG. 1. For example, vacuum nozzles 210A and 210B may correspond to nozzles 110A and 110B of system 100 and raster component 212 corresponds to raster component 112 of system 100.

Laser system 200 includes vacuum nozzles 210A and 210B positioned at angles A1 and A2, respectively, at a height H above gel layer 204 of electric component 201. A respective opening of nozzle 210A is positioned at a first angle A1 relative to apex 215 of plasma plume 214 and a respective opening of nozzle 210B is positioned at a second angle A2 relative to apex 215 of plasma plume 214 for simultaneously extracting first and second portions of plasma plume 214.

When raster component 212 projects a laser beam at gel layer 204, plasma plume 214 of superheated plasma is ejected upward from the area of gel layer 204 being irradiated by the laser. Vacuum nozzles 210A and 210B are positioned such that plasma plume 214 is sucked away via vacuum (not shown). To prevent carbonization of the side wall of the window of gel layer 204 being vaporized by the laser, the vacuum flow must be at a moderate setting. Moreover, the angles A1 and A2 and shape of vacuum nozzles 210A and 210B must be adjusted based on the size of the window being lazed. If the angles A1 and A2 are too shallow or too steep, the vacuum suction may over shoot the window being lazed by the laser and cause recast. The design and position of vacuum nozzles 210A and 210B are paramount for preventing recast. In some examples the first angle A1 is approximately 150 degrees relative to the surface of gel layer 204 and the second angle A2 is approximately 30 degrees relative to the surface of gel layer 204. Other angles may be used depending on the size of the window being lazed.

Figure 3A:
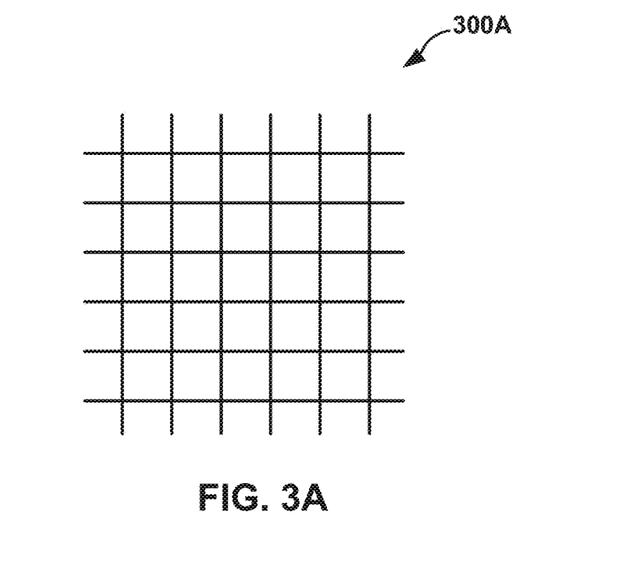
FIGS. 3A-3C are conceptual diagrams illustrating different fill patterns and nozzle positions of an example laser system for controlling the placement and location of the heat affected zone associated with a laser while removing a protective layer of dielectric gel from an electrical component, in accordance with one or more aspects of the present disclosure.
Figure 3B:
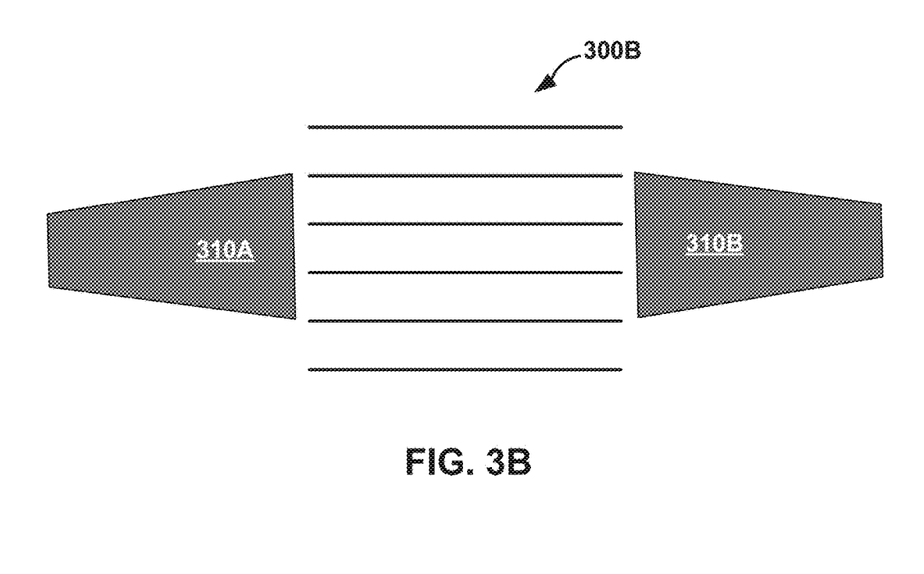
Figure 3C:
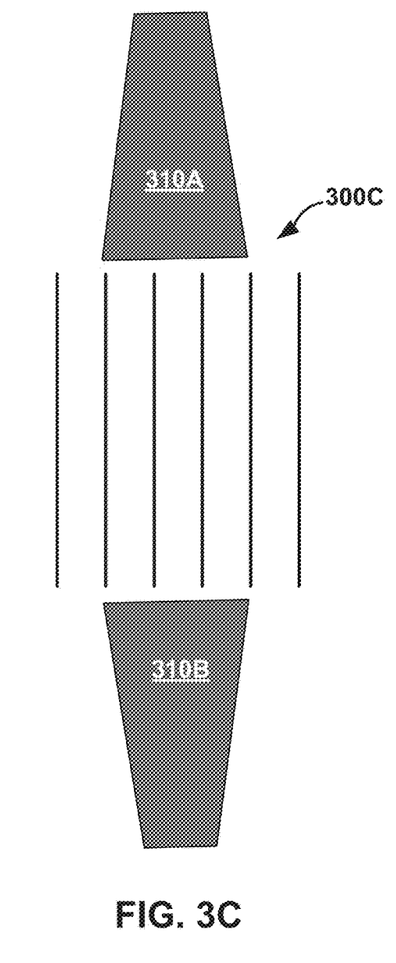

FIGS. 3A-3C are conceptual diagrams illustrating different fill patterns and nozzle positions of an example laser system for controlling the placement and location of the heat affected zone associated with a laser while removing a protective layer of dielectric gel from an electrical component, in accordance with one or more aspects of the present disclosure. There are three basic styles of the fill pattern: Cross, Vertical, and Horizontal.

FIG. 3A shows a cross fill pattern 300A. For the application of vaporizing dielectric gel, the cross fill pattern or cross grid allows for the potential of over-lapping heat-affected-zone areas resulting in far too much energy to be applied. Redundant over-lapping can result in the formation recast, topographic surface disruption, and residual carbonized gel simply because the beam passes over the same area multiple times. To optimize and regulate the energy applied to the gel, a horizontal, or vertical, fill pattern is far more efficient in allowing for a smoother distribution of the energy and better control.

FIG. 3B includes nozzles 310A and 310B positioned in-line with a horizontal fill pattern 300B and FIG. 3C includes nozzles 310A and 310B positioned in-line with a vertical fill pattern 300C. To prevent recast, one goal of the vaporization techniques described herein for removing a gel layer of an electric component is to vaporize the gel layer, in thin layers, one at a time with minimal surface disruption and with minimal impact to the next layer below that has yet to be vaporized. To assist in the removal of thin layers, one-at a time, a horizontal or vertical fill pattern with a 0.130 mm fill spacing may be used in accordance with heat affected zone methodologies. Whether vertical or horizontal, nozzles 310A and 310B are positioned in-line with the movement of the raster component that projects the laser as the raster component moves according to the fill pattern. In other words, if the movement of the laser goes from left to right according to the fill pattern of FIG. 3B, nozzle 310B may be in front of the laser and nozzle 310A may be behind the laser as the laser moves according to the fill pattern. If the movement of the laser goes from top to bottom according to the fill pattern of FIG. 3C, nozzle 310B may be in front of the laser and nozzle 310A may be behind the laser as the laser moves according to the fill pattern. Ensuring that nozzles 310A and 310B are in-line with the fill pattern may help better direct the vacuum extraction flow, and help to reduce the formation of recast, thereby creating a smooth ablation surface. As described above, the vacuum extraction velocity may be kept at a very low speed.

In some examples, the thickness of a gel layer to be removed during a failure analysis may be approximately 5 or 6 mm. The quantity of passes may depend on the thickness of the gel so as not to expose the components to superficial heating and thermal expansion. As described above, direct contact with the laser beam at the die layer can heat and potentially damage the die or introduce artifacts that mask the source of a failure. Therefore, in some examples, a thin layer of gel layer may be left and not removed by the laser to ensure that evidence is left intact. The thin layer of gel that is not removed by the laser can removed in minutes (rather than hours or days), for example, using solvent cleaning techniques.

Figure 4A:
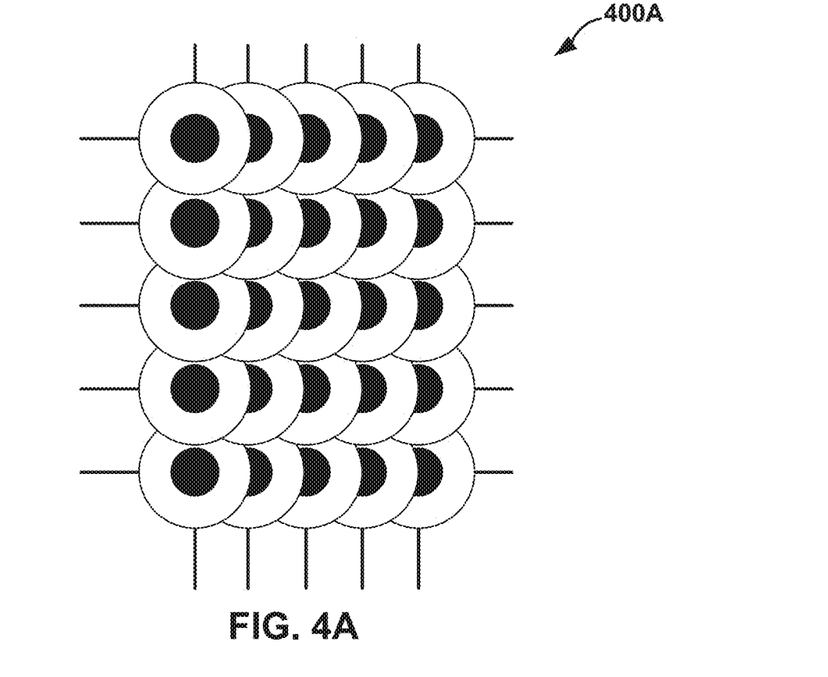
FIGS. 4A-4C are conceptual diagrams illustrating positional separations of heat-affected-zones created by an example laser system while removing a protective layer of dielectric gel from an electrical component, in accordance with one or more aspects of the present disclosure.
Figure 4B:
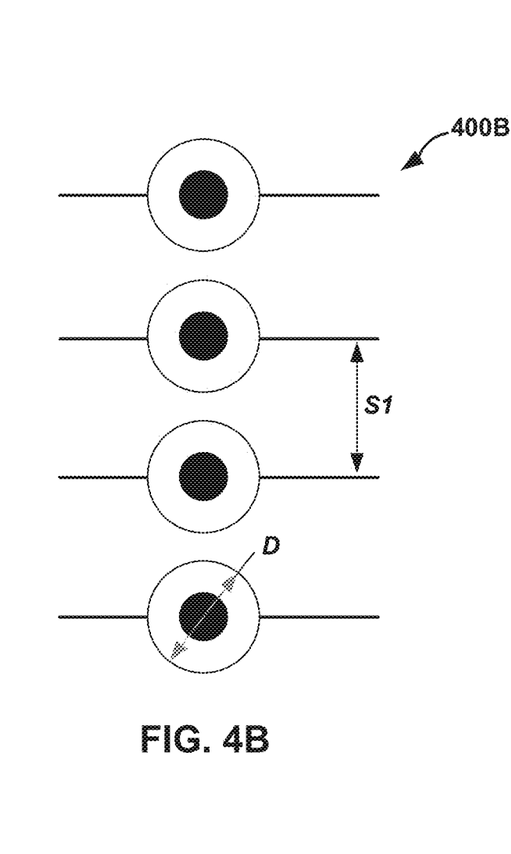
Figure 4C:
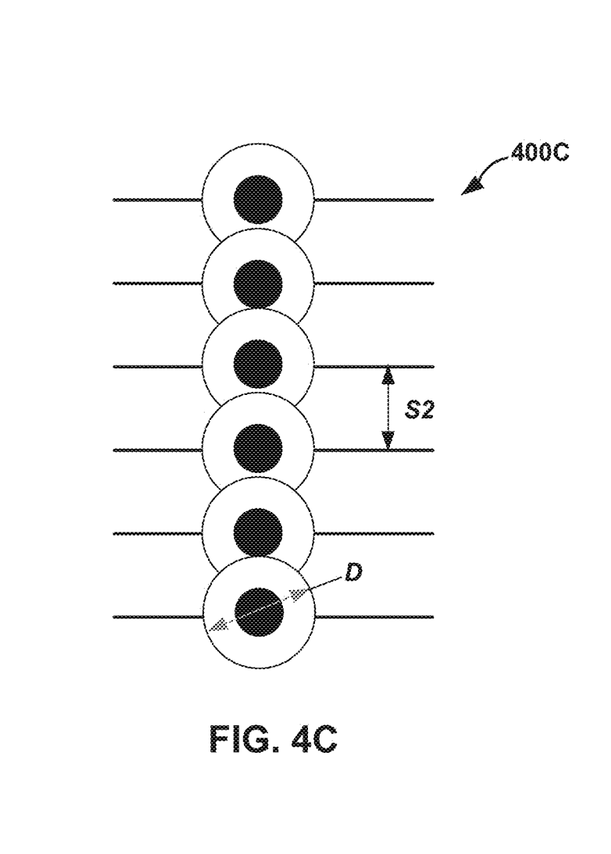

FIGS. 4A-3C are conceptual diagrams illustrating positional separations of heat-affected-zones created by an example laser system while removing a protective layer of dielectric gel from an electrical component, in accordance with one or more aspects of the present disclosure. As described above, there are three basic styles of the fill pattern: Cross, Vertical, and Horizontal. FIG. 4A shows cross-grid fill pattern 400A, FIG. 4B shows one example of a horizontal fill pattern 400B, and FIG. 4C shows a different example of a horizontal fill pattern 400C. In each of FIGS. 4A-4C, the locations of heat-affected-zones associated with the movement of the laser are shown.

To reduce or prevent recast, the placement of a heat-affected-zone of a laser may need to be controlled when removing a gel layer from an electric component. The fill spacing of the fill pattern or fill spacing of the grid may be critical regardless if the grid is horizontal or vertical. In some examples, if the spacing is too far apart, the heat-affected-zone areas may be equally too far apart for effective vaporization. And if the spacing is too close, the heat-affected-zone areas may overlap forming recast and carbonizing the surface. The fill spacing has to be adjusted for an effective vaporization process such that there is just enough over-lapping of heat-affected-zones during subsequent passes of the fill pattern so that a smooth ablation of the surface of the gel layer can be achieved.

In FIG. 4A, the cross-grid fill pattern 400A represents too much overlap of heat-affected-zones and may cause recast. In the example of FIG. 4A, the fill spacing is too close together, and if too much power is applied, the surface material will burn and carbonize. In FIG. 4B, horizontal fill pattern 400B has a spacing S1 between heat-affected-zones that is greater than the diameter D of each heat-affected-zone. In the example of FIG. 4B, the fill spacing is too far apart so that the surface topography may not be as smooth as desired as material is vaporized. In FIG. 4C, horizontal fill pattern 400C has a spacing S2 between heat-affected-zones that is less than the diameter D of each heat-affected-zone. FIG. 4C shows an example where the fill spacing has been adjusted such that there is just enough overlap between heat-affected-zones. With sufficient power to vaporize material, the resulting topology created by the vaporization gel removal process may create a topography that is smooth, flat, and free from recast and surface disruption.

Figure 5:
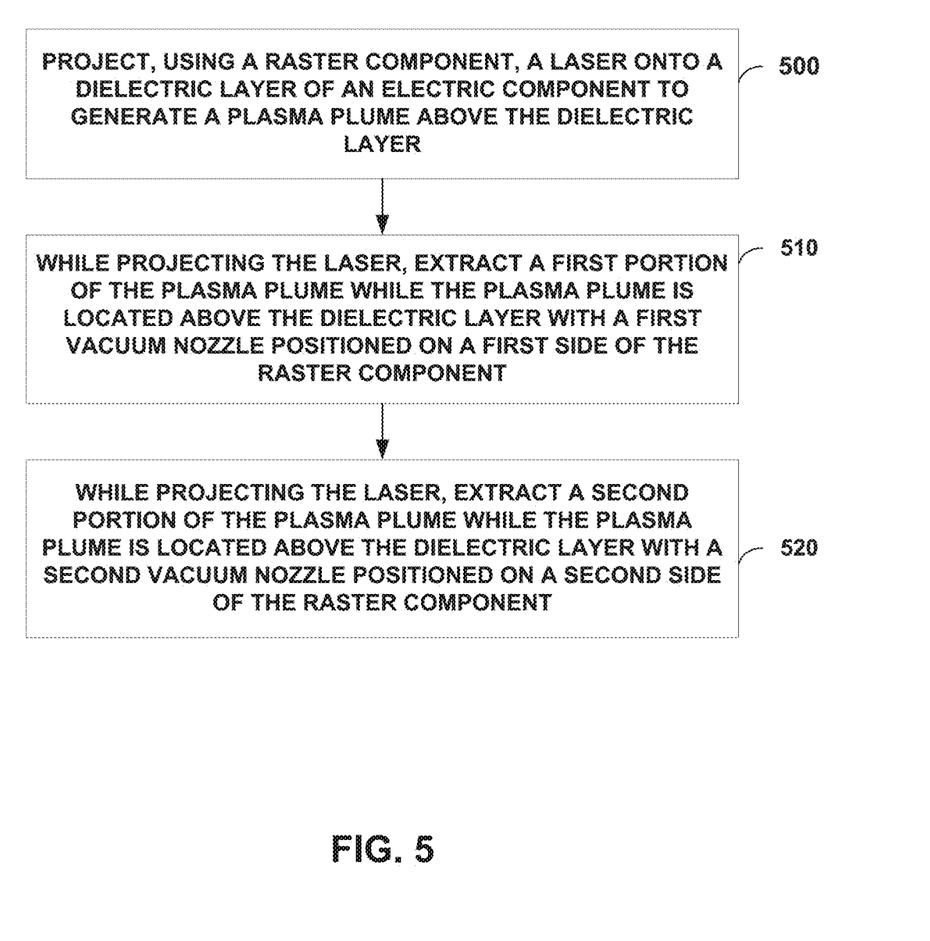
FIG. 5 is a flowchart illustrating example operations performed by an example laser system for removing a protective layer of dielectric gel from an electrical component, in accordance with one or more aspects of the present disclosure.

FIG. 5 is a flowchart illustrating example operations 500-520 performed by an example laser system for removing a protective layer of dielectric gel from an electrical component, in accordance with one or more aspects of the present disclosure. For example, a controller (e.g., a computing device, a processor, and the like) of a laser system such as system 100 of FIGS. 1A and 1B may perform operations 500-520 to cause raster component 112 to remove gel layer 104 from electric component 101. In some examples, a non-transitory computer readable storage medium may include instructions that, when executed by a processor of a laser system, cause the processor to perform operations 500-520. FIG. 5 is described below in the context of system 100 of FIGS. 1A and 1B.

In operation, laser system 100 may project, using a raster component, a laser onto a dielectric layer of an electric component to generate a plasma plume above the dielectric layer (500). For example, a processor or controller of raster component 112 may configure raster component 112 to project a CO2 laser beam onto gel layer 104 to vaporize gel layer 104 into plasma plume 114 of superheated dielectric material formed in the air space above gel layer 104.

While projecting the laser, laser system 100 may extract a first portion of the plasma plume while the plasma plume is located above the dielectric layer with a first vacuum nozzle positioned on a first side of the raster component (510). For example, nozzle 110B may be positioned in-front of, and in-line with, the movement of raster component 112 as raster component 112 projects the CO2 laser. Nozzle 110B may extract half of plasma plume 114 before plasma plume 114 can fall back onto electric component 101 and cause recast.

While projecting the laser, laser system 100 may also extract a second portion of the plasma plume while the plasma plume is located above the dielectric layer with a second vacuum nozzle positioned on a second side of the raster component (520). For example, nozzle 110A may be positioned behind, and in-line with, the movement of raster component 112 as raster component 112 projects the CO2 laser. Nozzle 110A may extract the remaining portion of plasma plume 114 that nozzle 110B fails to extract, before plasma plume 114 can fall back onto electric component 101 and cause recast.

In this way, nozzles 110A and 110B may prevent the carbonization of gel layer 104 (e.g., recast). In the event some carbonized gel is remaining after removal, the carbonized gel can be removed within mere minutes rather than hours or days. Through the described techniques, a gel layer of an electric component can be removed faster and by producing far less hazardous waste as compared to other techniques for dielectric removal. In addition, the techniques described herein result in little to no impact (e.g., no damage) on the die layer/substrate/and subcomponents and connections of that are beneath the dielectric layer so that evidence confirming a failure mechanism can be retained.

Clause 1. A system comprising: a raster component configured to project a laser for vaporizing a dielectric layer of an electric component into a plasma plume located above the dielectric layer; a first vacuum nozzle positioned on a first side of the raster component and configured to extract a first portion of the plasma plume while the plasma plume is located above the dielectric layer; and a second vacuum nozzle positioned on a second side of the raster component and configured to extract a second portion of the plasma plume while the plasma plume is located above the dielectric layer.

Clause 2. The system of clause 1, wherein the raster component is further configured to follow a fill pattern mapped atop the dielectric layer of the electric component while projecting the laser for vaporizing the dielectric layer, the fill pattern being either a cross grid, a vertical grid, or a horizontal grid.

Clause 3. The system of clause 2, wherein the fill pattern comprises a fill spacing that is less than a diameter of the plasma plume.

Clause 4. The system of any of clauses 2-3, wherein the first side of the raster component and the second side of the raster component are in-line with a direction that the raster component moves while following the fill pattern.

Clause 5. The system of clause 4, wherein the first nozzle is in-front of the plasma plume and the second nozzle is behind the plasma plume as raster component moves while following the fill pattern.

Clause 6. The system of any of clauses 1-5, wherein the first side of the raster and the second side of the raster are opposite sides of the raster.

Clause 7. The system of any of clauses 1-6, wherein a respective opening of the first nozzle is positioned at a first angle relative to an apex of the plasma plume and a respective opening of the second nozzle is positioned at a second angle relative to the apex of the plasma plume for simultaneously extracting the first and second portions of the plasma plume.

Clause 8. The system of any of clause 7, wherein the first angle is approximately 150 degrees and the second angle is approximately 30 degrees.

Clause 9. The system of any of any of clauses 1-7, wherein the laser is a continuous wave laser.

Clause 10. The system of clause 9, wherein the laser is a carbon dioxide laser comprising an approximately 10 micron wavelength and approximately 40 watts of power.

Clause 11. A method comprising: while projecting, from a raster component, a laser onto a dielectric layer of an electric component to generate a plasma plume above the dielectric layer: extracting, with a first vacuum nozzle positioned on a first side of the raster component, a first portion of the plasma plume while the plasma plume is located above the dielectric layer; and extracting, with a second vacuum nozzle positioned on a second side of the raster component, a second portion of the plasma plume while the plasma plume is located above the dielectric layer.

Clause 12. The method of clause 11, further comprising: while projecting the laser onto the dielectric layer of the electric component, following, by the raster component, a fill pattern mapped atop the dielectric layer of the electric component, the fill pattern being either a cross grid, a vertical grid, or a horizontal grid.

Clause 13. The method of clause 12, wherein the first side of the raster component and the second side of the raster component are in-line with a direction that the raster component moves while following the fill pattern.

Clause 14. The method of any of clauses 12-13, wherein the first nozzle is in-front of the plasma plume and the second nozzle is behind the plasma plume while raster component follows the fill pattern.

Clause 15. The method of any of clauses 11-14, wherein a respective opening of the first nozzle is positioned at a first angle relative to an apex of the plasma plume and a respective opening of the second nozzle is positioned at a second angle relative to the apex of the plasma plume for simultaneously extracting the first and second portions of the plasma plume.

Clause 16. The method of clause 15, wherein the first angle is approximately 150 degrees and the second angle is approximately 30 degrees.

Clause 17. The method of any of clauses 11-16, wherein the laser is a carbon dioxide, continuous wave laser.

Clause 18. A system comprising: means for projecting a laser onto a dielectric layer of an electric component to generate a plasma plume above the dielectric layer; means for extracting a first portion of the plasma plume while the plasma plume is located above the dielectric layer; and means for extracting a second portion of the plasma plume while the plasma plume is located above the dielectric layer.

Clause 19. The system of clause 18, wherein the means for projecting the laser onto the die electric layer further comprise means for following a fill pattern mapped atop the dielectric layer of the electric component while projecting the laser onto the dielectric layer of the electric component, the fill pattern being either a cross grid, a vertical grid, or a horizontal grid.

Clause 20. The system of any of clauses 18-19, wherein the first portion of the plasma plume and the second portion of the plasma plume together comprise a combined volume corresponding to a volume of the plasma plume.

Clause 21. A system comprising means for performing any of the methods of clauses 11-17.

Clause 22. A computer-readable storage medium comprising instructions that, when executed by a processor of a system, configure the system to perform any of the methods of clauses 11-17.

Various examples have been described. These and other examples are within the scope of the following claims.

What is claimed is:

1. A system comprising:
a raster component comprising laser optics, the raster component being configured to project, with the laser optics, a laser that vaporizes a dielectric layer of an electric component to eject a plasma plume upward from an area of the dielectric layer being irradiated by the laser optics, wherein the laser is a continuous wave laser and wherein the raster component is configured to operate the laser optics at a power setting, with a laser spot pattern, a laser duty cycle, and a laser galvanic speed that prevents damage of the electric component and vaporizes the dielectric layer;
a first vacuum nozzle positioned on a first side of the raster component and configured to extract a first portion of the plasma plume at an apex of the plasma plume while the plasma plume ejects upward from the area of the dielectric layer being irradiated and before the first portion of the plasma plume contacts the electric component, wherein a respective opening of the first vacuum nozzle is positioned between the raster component and the electric component at a first angle relative to the apex of the plasma plume; and
a second vacuum nozzle positioned on a second side of the raster component and configured to extract a second portion of the plasma plume at the apex of the plasma plume while the plasma plume ejects upward from the area of the dielectric layer being irradiated and before the second portion of the plasma plume contacts the electric component, wherein a respective opening of the second vacuum nozzle is positioned between the raster component and the electric component at a second angle relative to the apex of the plasma plume and wherein the second vacuum nozzle extracts the second portion of the plasma plume simultaneously to the extraction of the first portion of the plasma plume by the first vacuum nozzle
wherein the first vacuum nozzle and the second vacuum nozzle move in-line with a direction of movement of the raster component with respect to the electric component, and wherein the first vacuum nozzle is in front of the raster component and the second vacuum nozzle is behind the raster component as the raster component is moved.

2. The system of claim 1, wherein the raster component is further configured to follow a fill pattern mapped atop the dielectric layer of the electric component while projecting, with the laser optics, the laser for vaporizing the dielectric layer, the fill pattern being either a cross grid, a vertical grid, or a horizontal grid.

3. The system of claim 2, wherein the fill pattern comprises a fill spacing that is less than a diameter of a heat-affected-zone of the dielectric layer, wherein the laser creates the heat-affected-zone while vaporizing the dielectric layer.

4. The system of claim 2, wherein the first side of the raster component and the second side of the raster component are in-line with a direction that the raster component moves while following the fill pattern.

5. The system of claim 4, wherein the first vacuum nozzle is in-front of the plasma plume and the second vacuum nozzle is behind the plasma plume as the raster component moves while following the fill pattern.

6. The system of claim 1, wherein the first side of the raster component and the second side of the raster component are opposite sides of the raster component.

7. The system of claim 1, wherein the first angle is 150 degrees and the second angle is 30 degrees.

8. The system of claim 1, wherein the laser is a carbon dioxide laser comprising an approximately 10 micron wavelength and approximately 40 watts of power.

9. The system of claim 1, wherein the first portion of the plasma plume and the second portion of the plasma plume together comprise a combined volume corresponding to a volume of the plasma plume.

10. The system of claim 1, wherein the electric component comprises a die layer, wherein the dielectric layer is deposited atop the die layer, and wherein the raster component is configured to project, with the laser optics, the laser that vaporizes the dielectric layer of the electric component without protruding into the die layer.

11. A method comprising:
while projecting, from a raster component comprising laser optics, a laser that vaporizes a dielectric layer of an electric component to eject a plasma plume upward from an area of the dielectric layer being irradiated by the laser optics:
extracting, with a first vacuum nozzle positioned on a first side of the raster component, a first portion of the plasma plume at an apex of the plasma plume while the plasma plume ejects upward from the area of the dielectric layer being irradiated and before the first portion of the plasma plume contacts the electric component, wherein a respective opening of the first vacuum nozzle is positioned between the raster component and the electric component at a first angle relative to the apex of the plasma plume; and
extracting, with a second vacuum nozzle positioned on a second side of the raster component, a second portion of the plasma plume at the apex of the plasma plum while the plasma plume ejects upward from the area of the dielectric layer being irradiated and before the second portion of the plasma plume contacts the electric component, wherein a respective opening of the second vacuum nozzle is positioned between the raster component and the electric component at a second angle relative to the apex of the plasma plume and wherein the second vacuum nozzle extracts the second portion of the plasma plume simultaneously to the extraction of the first portion of the plasma plume by the first vacuum nozzle,
wherein the laser is a continuous wave laser and wherein projecting the laser comprises operating the laser optics at a power setting, with a laser spot pattern, a laser duty cycle, and a laser galvanic speed that prevents damage of the electric component and vaporizes the dielectric layer
wherein the first vacuum nozzle and the second vacuum nozzle move in-line with a direction of movement of the raster component with respect to the electric component, and
wherein the first vacuum nozzle is in front of the raster component and the second vacuum nozzle is behind the raster component as the raster component is moved.

12. The method of claim 11, further comprising:
while projecting the laser onto the dielectric layer of the electric component, following, by the raster component, a fill pattern mapped atop the dielectric layer of the electric component, the fill pattern being either a cross grid, a vertical grid, or a horizontal grid.

13. The method of claim 12, wherein the first side of the raster component and the second side of the raster component are in-line with a direction that the raster component moves while following the fill pattern.

14. The method of claim 12, wherein the first nozzle is in-front of the plasma plume and the second nozzle is behind the plasma plume while raster component follows the fill pattern.

15. The method of claim 11, wherein the first angle is 150 degrees and the second angle is 30 degrees.

16. The method of claim 11, wherein the laser is a carbon dioxide, continuous wave laser.

* * * * *